United States Patent
Kuijken

(10) Patent No.: US 7,869,773 B2
(45) Date of Patent: Jan. 11, 2011

(54) RF POWER SENSING CIRCUIT

(75) Inventor: Onno Marcel Kuijken, Nijmegen (NL)

(73) Assignee: NXP B.V., Eindhoven (NL)

( * ) Notice: Subject to any disclaimer, the term of this patent is extended or adjusted under 35 U.S.C. 154(b) by 605 days.

(21) Appl. No.: 11/573,348

(22) PCT Filed: Jul. 27, 2005

(86) PCT No.: PCT/IB2005/052530

§ 371 (c)(1),
(2), (4) Date: Aug. 15, 2007

(87) PCT Pub. No.: WO2006/016309

PCT Pub. Date: Feb. 16, 2006

(65) Prior Publication Data

US 2008/0278141 A1 Nov. 13, 2008

(30) Foreign Application Priority Data

Aug. 6, 2004 (EP) ................... 04103792

(51) Int. Cl.
*H04B 1/04* (2006.01)
(52) U.S. Cl. .................. 455/127.1; 455/115.4; 455/333
(58) Field of Classification Search ............. 455/115.1, 455/115.3, 115.4, 127.1, 333, 334, 339, 341
See application file for complete search history.

(56) References Cited

U.S. PATENT DOCUMENTS

| | | | |
|---|---|---|---|
| 5,381,137 A * | 1/1995 | Ghaem et al. ............ 340/572.5 |
| 6,265,943 B1 | 7/2001 | Dening et al. | |
| 7,433,658 B1 * | 10/2008 | Shirvani-Mahdavi et al. ........................ 455/127.2 |
| 2004/0070453 A1 | 4/2004 | Dupuis et al. | |
| 2005/0030101 A1 * | 2/2005 | Ichitsuho et al. ............ 330/285 |

FOREIGN PATENT DOCUMENTS

| | | |
|---|---|---|
| CN | 1374764 A | 10/2002 |
| EP | 0852434 A2 | 7/1998 |
| EP | 1317064 A1 | 6/2003 |
| JP | 04-023315 U | 2/1992 |

OTHER PUBLICATIONS

International Preliminary Report on Patentabilty for int'l. patent appln. No. PCT/IB2005/052530 (Feb. 6, 2007).

* cited by examiner

*Primary Examiner*—Nhan Le

(57) ABSTRACT

The present invention provides an electronic circuit for measuring of an output power of a RF power amplifier. The electronic circuit comprises a current sensing transistor for sensing the RF current of the power amplifier and a voltage sensing module for sensing the voltage of the RF power amplifier. The electronic circuit further comprises a coherent detector for multiplying the sensed current and the sensed voltage in the time domain. In this way a signal is generated that is directly indicative of the power provided by the power amplifier irrespective of its actual load. Preferably, the coherent detector is implemented as a Gilbert quad and provides a differential output that effectively allows for DC offset compensation.

9 Claims, 2 Drawing Sheets

RF POWER SENSING CIRCUIT

Figure 1:
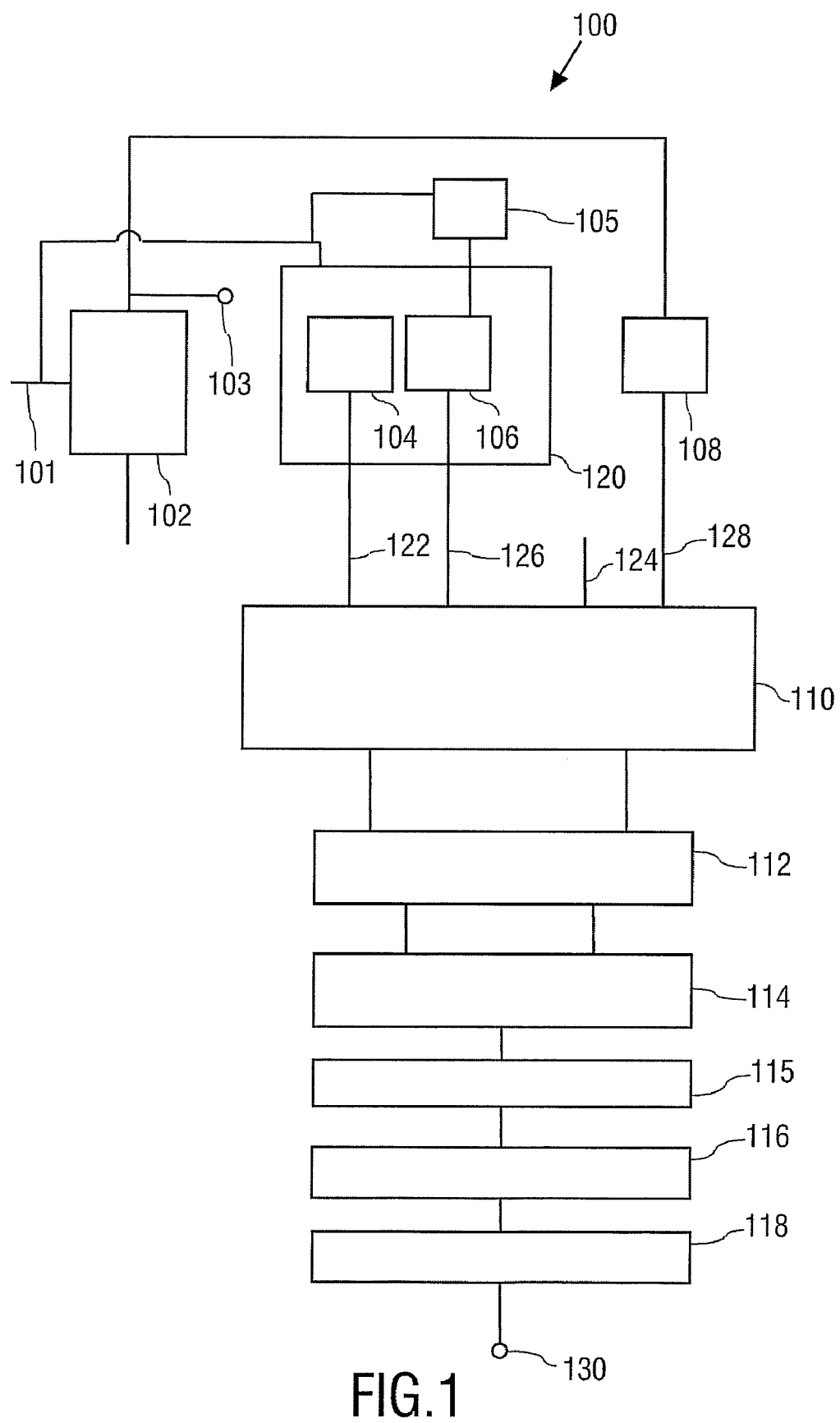

The present invention relates to the field of RF transmission and in particular without limitation to power sensing of an RF power amplifier.

Wireless communication systems are typically based on transmission of radio frequency (RF) signals. Mobile stations, such as mobile cellular phones have to provide sufficient RF signal amplification that guarantees a reliable communication link to a remote communication component of a mobile telecommunication network, such as a mobile node. Typically, a mobile station features a circuitry that senses the RF power delivered by the power amplifier of the mobile station. Determination of the RF power is important for controlling of the RF power amplifier. The load that is coupled to the RF amplifier might become subject to strong fluctuations that in turn may have a severe impact on the operation of the amplifier. For example, load variations of RF power amplifiers might be due to interaction between an antenna of a mobile station and its operation environment. Hence, metal objects in the vicinity of the antenna may remarkably change the antenna's impedance. Such load variations may also lead to a reflection of power from the antenna towards the power amplifier and thereby represent a load mismatch. A large mismatch condition may lead to excessive current or voltage peaks at the output terminals of the power amplifier that may shorten the amplifier's lifetime and may even eventually lead to damage.

In the prior art power sensing is typically performed with one or two directional couplers and a diode detector. In particular, bidirectional couplers allow to effectively sense the RF power delivered by the power amplifier and to sense an RF power reflected by a mismatched load. This gives a measure for a mismatch of the load, e.g. the antenna, and can be effectively used to reduce the power delivered in case of a too severe mismatch. However, these couplers, either unidirectional or bidirectional do in principle not allow for a sufficiently accurate power sensing as they typically provide incorrect information in situations in which the load impedance varies.

Moreover, these couplers are rather large in size and do therefore not fulfill size restrictions that are requested for most modern and compact wireless communication devices. An alternative to couplers is given by an implementation based on so-called mirror transistors. A mirror transistor is a scaled-down copy of the output transistor of the power amplifier and provides a scaled-down copy of the RF current. By rectifying and averaging of the sensed RF current, a measure for the RF power delivered by the power amplifier can be given. However, this mirror transistor does by no means sense the power being reflected by a possibly mismatched load. A sensed RF current only represents a RF power in an indirect way. In particular, in case of a phase mismatch between RF current and RF voltage, RF power sensing based on sensing of an RF current might be insufficient.

Another indirect measure for RF power can be realized by making use of tapping a small portion of the RF voltage that builds up at the output terminals of the RF power amplifier. Tapping of such a small portion of the voltage can in principle by realized by coupling an appropriate sensing circuitry to the output terminals by means of a capacitor featuring a very low capacitance. However, determination of a RF voltage neither accounts for a phase mismatch between RF voltage and RF current. A resulting power determination is therefore insufficient.

The document EP 0852434 A2 discloses a transmitter with a high frequency power amplifier and measuring devices for measuring the power of a high frequency signal. The measuring devices make use of a first and a second differential amplifier. Here, the first differential amplifier provides a voltage that is proportional to the high frequency collector-emitter voltage of an output transistor of the high frequency power amplifier. The second differential amplifier serves to sense a voltage that is proportional to the high frequency emitter current of the output transistor of the power amplifier. The average power of the output transistor of the power amplifier can be determined by directing the output signal of the first differential amplifier and the output signal of the second differential amplifier to a multiplier circuit. This multiplier circuit forms a signal proportional to each instantaneous power, which signal is integrated in an integrator for forming a voltage proportional to the mean value of the real power. Determination of the average power of the output transistor of the power amplifier is performed by multiplying the voltage by a current value.

Hence, the document EP0852434 A2 only discloses an indirect multiplication of current and voltage. A multiplication operation is performed on the basis of two voltage signals, one of which being derived from the current in the output transistor of the power amplifier by means of a resistor in series with the emitter of the output transistor. This in principle has a negative impact on the gain and power capability of the output transistor.

The present invention therefore aims to provide a true measure of an RF power delivered to a load irrespective of the load's actual impedance.

The invention provides an electronic circuit for measuring of an output power of a RF power amplifier. The electronic circuit comprises a first transistor for sensing the current of the output of the RF power amplifier and for providing a RF current signal. In this context sensing refers to a direct sensing of the RF current and not to a sensing of a voltage being proportional to the RF current. The electronic circuit further comprises a voltage sensing module for sensing the voltage of the output of the RF power amplifier and for providing a RF voltage signal. The inventive electronic circuit further comprises a coherent detector that is adapted to multiply the RF voltage signal and the RF current signal.

The first transistor for sensing the current of the output of the RF power amplifier is preferably implemented as a scaled-down copy of the output transistor of the RF power amplifier. This first transistor therefore acts as a current sensing transistor. Its base is preferably coupled to the base of the output transistor of the power amplifier. Hence, the current flowing through this first transistor is therefore a scaled-down copy of the output current of the power amplifier.

The voltage sensing module is preferably implemented on the basis of a coupling capacitor featuring a very low capacitance. Preferably, the voltage sensing module is coupled to the output of the power amplifier. In this way a current and a voltage representing output current and output voltage of a power amplifier can be fed into a coherent detector that serves to multiply the provided RF voltage signal and the RF current signal. By multiplication of the RF voltage signal and the RF current signal, a power signal is generated that is indicative of the instantaneous power of the RF power amplifier. In particular, the power signal can be generated without transformation of the RF output current into a voltage as being described in EP 0852434 A2.

The inventive electronic circuit therefore simultaneously senses RF current and RF voltage of a RF power amplifier and performs multiplication in the time domain in order to provide an output signal that is proportional to the product of RF voltage, RF current and the cosine of the respective phase angle. The output signal of the coherent detector therefore represents an instantaneous power signal irrespective of the actual load of the power amplifier. In this way any load mismatch can be effectively detected and the power amplifier can be accordingly controlled in order to prevent generation of excessive current or voltage peaks at its output terminals.

According to a preferred embodiment of the invention, the coherent detector is implemented as a Gilbert quad that is adapted to multiply the RF current signal and the RF voltage signal and to provide the resulting multiplied signal in form of a differential output. The Gilbert quad serves as a double-balanced mixer and converts RF information directly into DC information on its output. In this way a subsequent rectification and integration of the resulting signal does not have to be performed. Moreover, by providing a multiplied power signal in form of a differential output, the Gilbert quad is effectively insensitive to a DC offset of any input signal. The differential output is suitable for further processing, such as DC offset compensation and similar filtering procedures.

According to a further preferred embodiment of the invention, the RF voltage signal is provided to the coherent detector by means of a first and a second RF voltage signal. The first RF voltage signal is in anti-phase with respect to the second RF voltage signal. This anti-phase configuration is a preferred operation mode of the Gilbert quad. The first and the second RF voltage signals are coupled to a pair of bases of the Gilbert quad. In this way a preferred mode of operation of the Gilbert quad can be effectively implemented. Alternatively, one of the first and second RF voltage signals can be replaced by a DC voltage signal featuring the same DC offset as the other voltage signal providing the RF voltage.

According to a further preferred embodiment of the invention, the electronic circuit further comprises a second transistor that is adapted to generate a DC offset signal in response to sense a quiescent current of the RF power amplifier. This second transistor is further adapted to provide the DC offset signal to the coherent detector. Preferably, this second transistor is also implemented as a scaled-down copy of the output transistor of the power amplifier. This second transistor is coupled via a low-pass filter to the bias voltage of the output transistor of the power amplifier. Therefore, the current flowing through the second transistor represents a measure of the quiescent current flowing in the output transistor of the power amplifier. By means of sensing this quiescent current of the output transistor, the coherent detector or the Gilbert quad can be effectively provided with an offset compensation that inherently increases the dynamic range of the entire power sensing electronic circuit.

According to a further preferred embodiment of the invention, the electronic circuit further comprises a low-pass filter for suppressing RF components of the output of the coherent detector. Preferably, the low-pass filter is adapted to receive the differential signal generated by means of the Gilbert quad. Since the Gilbert quad acts as a double-balanced mixer operating on two signals featuring the same RF frequency, the output signal inevitably features a component of twice the RF frequency of the input signals. The low-pass filter effectively provides filtering of 2RF components of the differential output signal of the double-balanced mixer. Hence, the low-pass filter compensates a side effect of the double-balanced mixer and eliminates at least the 2RF components that might perturb a subsequent signal processing.

According to a further preferred embodiment of the invention, the electronic circuit further comprises a first current mirror that is adapted to subtract a DC component of the output of the coherent detector. Preferably, this first current mirror arrangement subtracts the DC component of the output of the coherent detector after filtering of RF components performed by the low-pass filter. Subtraction of the DC component may also refer to suppression or filtering of the DC component. The first current mirror arrangement is particularly advantageous in combination with the differential output provided by the two output terminals of the Gilbert quad. In this way a common mode impact on the output terminals of the electronic components of the Gilbert quad can be inherently eliminated.

According to a further preferred embodiment of the invention, the electronic circuit further comprises a second current mirror arrangement for inverting the output signal of the first current mirror arrangement. This inverting is particularly advantageous for reasons of voltage headroom.

According to a further preferred embodiment of the invention, the electronic circuit further comprises a logarithmic converter module for converting the output of the coherent detector into a voltage that is indicative of the power of the RF power amplifier on a logarithmic scale. Typically, the differential output of the coherent detector or any of the signals provided by the low-pass filter or the first or second current mirrors is indicative of the RF power of the power amplifier in watts.

Because the RF current sensed by means of the first transistor as well as the RF voltage signal tapped by means of the voltage sensing module are both linearly proportional to the respective RF current and RF voltage of the output transistor of the power amplifier, also the resulting power signal derived by means of multiplication of the RF voltage signal and the RF current signal is also linearly proportional to the RF power delivered by the power amplifier. Here, the logarithmic converter module serves to convert the derived power signal into a power signal that can be expressed in dBm. For example, the logarithmic converter module can be implemented by means of a transistor in a current-to-voltage converter arrangement.

Preferably, the resulting voltage may further be amplified by e.g. an operational amplifier circuit. This amplified voltage signal, that is indicative of the power amplifier's power output may then be provided by means of an output resistor. The output signal that can finally be tapped at the output of the inventive electronic circuit therefore represents an actual power provided by the power amplifier in an accurate way, even when the load is subject to temporal fluctuations.

In another aspect, the invention provides a wireless communication device that has a RF transmission unit, a RF power amplifier and power regulation means for regulating the power transmitted by the RF transmission unit. The wireless communication device comprises a first transistor for sensing the current of the output of the RF power amplifier and for providing a RF current signal. The wireless communication device further comprises a voltage sensing module for sensing the voltage of the output of the RF power amplifier and for providing a RF voltage signal. The wireless communication device also comprises a coherent detector that is adapted to multiply the RF voltage signal and the RF current signal. Hence, the inventive wireless communication device features effective means for separately sensing the RF current and the RF voltage of the power amplifier of a RF transmission unit and means for determining the power provided to a load irrespective of the impedance of the load.

The power regulation means of the wireless communication device are particularly adapted to compare a required power and a measured power in order to minimize a load mismatch between the power amplifier and the load.

Further it is to be noted that any reference signs in the claims shall not be construed as limiting the scope of the invention.

Figure 2:
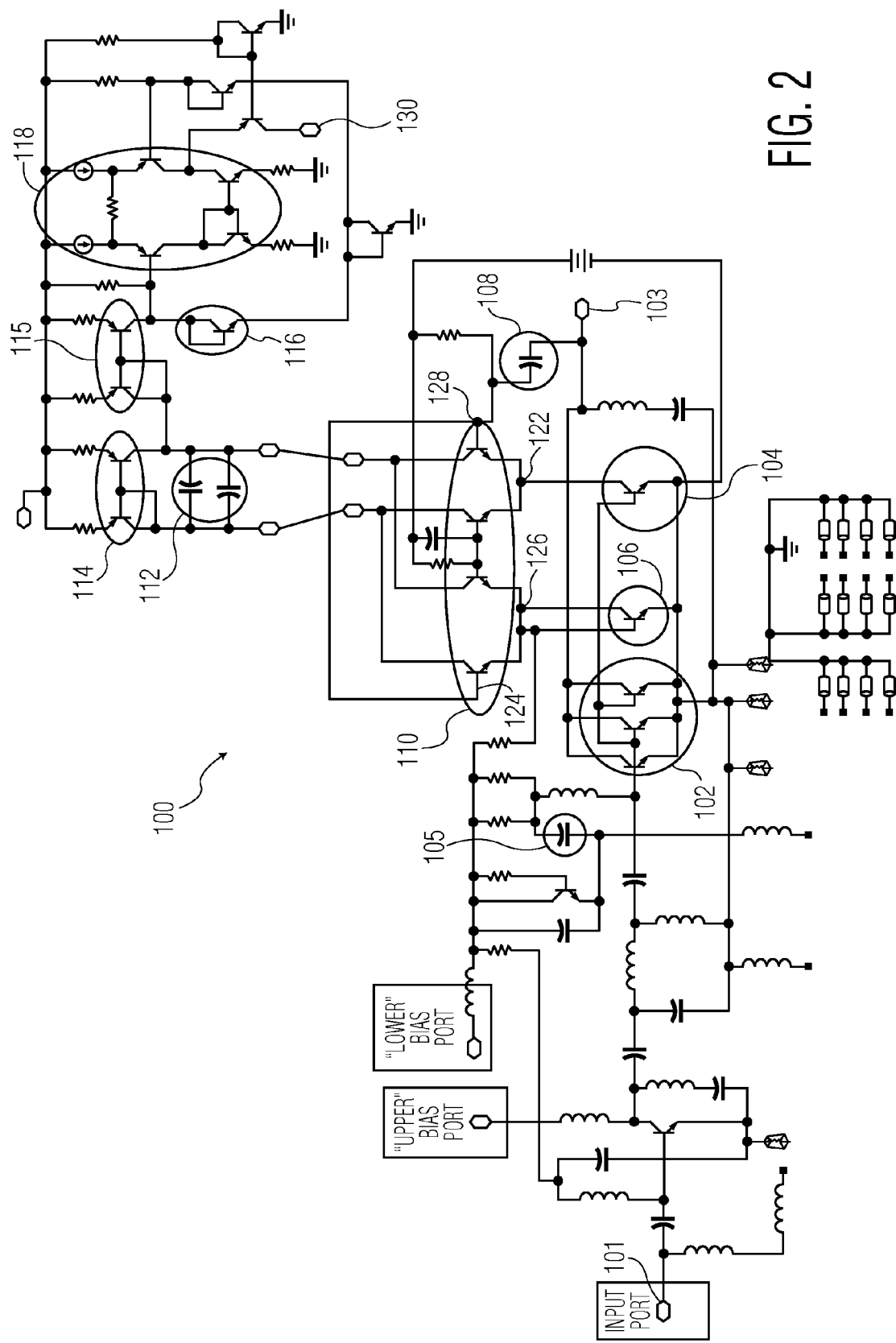

In the following, preferred embodiments of the invention will be described in greater detail by making reference to the drawings in which:

FIG. 1 shows a block diagram of various electronic components of the inventive electronic circuit, FIG. 2 shows a detailed circuit diagram of the electronic circuit with reference to the electronic components shown in FIG. 1.

FIG. 1 shows a schematic block diagram of the inventive electronic circuit 100. The electronic circuit 100 is adapted to measure the output power of a RF power amplifier 102. The electronic circuit 100 has a sensing module 120, a coherent detector module 110, a low-pass filter 112, two current mirrors 114, 115, a logarithmic converter 116, an amplifier 118 as well as an output terminal 130. The sensing module 120 has a current sensing transistor 104 and a DC offset transistor 106. The components of the sensing module 120 are adapted to sense and to tap RF currents well as a DC offset of the RF power amplifier 102. The RF power amplifier 102 is preferably implemented as a RF transistor featuring a base that serves as input terminal of the power amplifier. The collector of the RF transistor 102 is preferably connected to the output terminal 103 of the power amplifier for coupling of the amplified signals to a load.

The components 104 and 106 of the sensing module 120 are coupled in different ways to the RF transistor 102. The base of the current sensing transistor 104 is preferably coupled to the base of the RF transistor 102 and its collector is preferably coupled to an emitter 122 of the coherent detector 110. Typically, the current sensing transistor 104 is a scaled-down copy of the RF transistor 102. Therefore, the current flowing through the transistor 104 is also a scaled-down copy of the current flowing through the RF transistor 102.

The DC offset transistor 106 is typically also implemented as a scaled-down copy of the RF transistor 102. Its base is preferably coupled to the base of the RF transistor 102 via the low-pass filter 105 and its collector is coupled to the second emitter 126 of the Gilbert quad 110. The DC offset transistor 106 is adapted to measure a quiescent current flowing in the RF transistor 102. It therefore provides an input to the coherent detector 110 that can be effectively used for DC offset compensation and hence for increasing the dynamic range of the entire electronic circuit 100.

The voltage sensing module 108 can be implemented by means of a capacitor featuring a very low capacitance in order to keep the voltage sensing modules' impact on the collector emitter voltage of the transistor 102 on a minimal level. The voltage sensing module 108, hence its coupling capacitor, might be coupled to the output terminal 103 or to the collector of the RF transistor 102. It may further be coupled to one of the bases of the Gilbert quad 128. The remaining input port 124 of the Gilbert quad may be coupled to a voltage signal being in anti-phase to the RF voltage signal provided by the voltage sensing module 108. Alternatively, the second base 124 of the Gilbert quad 110 can be provided with a DC voltage that corresponds to a DC offset of the RF voltage signal provided to the base 128 of the Gilbert quad 110.

The sensing module 120 therefore provides a RF current signal and the voltage sensing module 108 provides a RF voltage signal to the Gilbert quad 110 that in turn is adapted to multiply the received RF current and RF voltage in order to generate an output signal being indicative of the actual power provided by the RF transistor 102. Since this power signal is based on a multiplication of voltage and current, the resulting power signal is entirely decoupled from a load impedance that is coupled to the output terminal 103 of the RF transistor 102.

Hence, the power can be sufficiently determined irrespective of a momentary load impedance. Since the Gilbert quad 110 is implemented as a double-balanced mixer, it serves to convert the input RF information directly to DC output information. In this way, additional rectifying and integrating modules are not necessary for a power determination.

The Gilbert quad 110 provides a differential output that is provided to a low-pass filter 112 for filtering of high frequency components of the output signal that are an inevitable by-product of the multiplication performed by means of the Gilbert quad 110. Typically, the two RF component is filtered and suppressed by means of the low-pass filter 112.

After passing through the low-pass filter 112, the signals are fed into the current mirror 114 that serves to subtract the DC component of the power signal. In this way, any common mode artifacts of e.g. the Gilbert quad can be effectively eliminated.

Subsequently, the remaining signal is provided to a second current mirror 115 providing an inversion of the signal. Such an inversion is particularly advantageous for reasons of voltage headroom.

After subtraction of this DC component, the remaining signal is provided to the logarithmic converter 116 that serves as a current-to-voltage converter with a logarithmic transfer function. In this way the resulting signal is no longer linear proportional to the power provided by the RF transistor 102, but represents a power on a dBm scale.

After the logarithmic conversion, the converted signal is typically amplified by means of the amplifier 118 that can be implemented as a conventional operational amplifier. Finally, the amplified signal can be tapped at the output terminal 130. It can then be used for further processing and/or for regulating the amplification performed by the RF transistor 102. In this way, an actual power provided by an RF transistor 102 can be precisely determined irrespective of a load impedance. Implementing the inventive electronic circuit 100 into a control loop effectively allows to dynamically adapt and to dynamically control the output power of a RF transistor. Hence, the output power of a power amplifier can be effectively controlled in order to minimize a load mismatch and thereby to effectively prevent rising of excessive current or voltage peaks that may destroy the RF transistor 102.

FIG. 2 shows a detailed circuit diagram of the electronic circuit with reference to the various electronic components displayed in FIG. 1 in a schematic way. As can be seen in FIG. 2, the Gilbert quad 110 is implemented by altogether four separate transistors and the RF transistor 102 is realized by means of three coupled transistors. Coupling of the current sensing transistor 104 and the transistor for the DC offset compensation 106 to the RF transistor 102 and to the Gilbert quad 110 is explicitly illustrated. The voltage sensing module 108 is shown as a capacitance and the base 124 of the Gilbert quad is coupled to a DC voltage. The collectors of the transistors 104 and 106 are coupled to the emitters 122 and 126 of the Gilbert quad 108 respectively.

The inventive electronic circuit 100 is by no means restricted to a distinct electronic technology. In principle, the various components of the electronic circuit 100 can be realized on the basis of bipolar devices or silicon based technology. In particular, all electronic components, the current sensing transistor 104, the DC offset transistor 106, the coherent detector or Gilbert quad 110, the low-pass filter 112, the current mirror 114 as well as the logarithmic converter 116 and the amplifier 118 can be based on metal-oxide semiconductor technology (MOS) or on complementary metal-oxide semiconductor technology (CMOS). Preferably, the logarithmic converter 116 may be implemented on the basis of silicon bipolar technology. Transistors of the current mirror 114 as well as of the coherent detector or Gilbert quad 110 can be implemented on the basis of Gallium Arsenide (GaAs) heterojunction bipolar transistor (HBT) technology.

LIST OF REFERENCE NUMERALS

100 electronic circuit
101 input
102 RF power amplifier
103 power output
104 current sensing transistor
105 low-pass filter
106 DC offset transistor
108 voltage sensing module
110 coherent detector
112 low-pass filter
114 current mirror
115 current mirror
116 logarithmic converter
118 amplifier
120 mirror module
122 input port
124 input port
126 input port
128 input port
130 output

The invention claimed is:

1. An electronic circuit for measuring of an output power of a radio-frequency power amplifier the electronic circuit comprising:
a first transistor for sensing the current of the output of the radio-frequency power amplifier and for providing a RF current signal,
a voltage sensing module for sensing the voltage of the output of the radio-frequency power amplifier and for providing a RF voltage signal,
a coherent detector being adapted to multiply the RF voltage signal and the RF current signal.

2. The electronic circuit according to claim 1, wherein the coherent detector is implemented as a Gilbert quad being adapted to multiply the RF current signal and the RF voltage signal and to provide a multiplied signal in form of a differential output.

3. The electronic circuit according to claim 1, wherein the RF voltage signal being provided to the coherent detector by means of a first and a second RF voltage signal, the first RF voltage signal being in anti-phase with respect to the second RF voltage signal.

4. The electronic circuit according to claim 1, further comprising a second transistor being adapted to generate a DC offset signal in response to sense a quiescent current of the RF power amplifier the second transistor being further adapted to provide the DC offset signal to the coherent detector.

5. The electronic circuit according to claim 4, wherein the second transistor being coupled to the radio-frequency power amplifier by means of a low-pass filter.

6. The electronic circuit according to claim 1, further comprising a low-pass filter for suppressing RF components of the output of the coherent detector.

7. The electronic circuit according to claim 1, further comprising a first current mirror being adapted to subtract a DC component of the output of the coherent detector.

8. The electronic circuit according to claim 5, further comprising a logarithmic converter module for converting the output of the coherent detector into a voltage being indicative of the power of the radio-frequency power amplifier on a logarithmic scale.

9. A wireless communication device having a radio-frequency transmission unit, a radio-frequency power amplifier and power regulation means for regulating the power transmitted by the radio-frequency transmission unit, the wireless communication device comprising:
a first transistor for sensing the current of the output of the radio-frequency power amplifier and for providing a RF current signal,
a voltage sensing module for sensing the voltage of the output of the radio-frequency power amplifier and for providing a RF voltage signal,
a coherent detector being adapted to multiply the RF voltage signal and the RF current signal.

* * * * *